(12) United States Patent
Xie et al.

(10) Patent No.: US 12,310,054 B2
(45) Date of Patent: May 20, 2025

(54) LATE REPLACEMENT BOTTOM ISOLATION FOR NANOSHEET DEVICES

(71) Applicant: International Business Machines Corporation, Armonk, NY (US)

(72) Inventors: Ruilong Xie, Niskayuna, NY (US); Andrew M. Greene, Slingerlands, NY (US); Julien Frougier, Albany, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 498 days.

(21) Appl. No.: 17/487,301

(22) Filed: Sep. 28, 2021

(65) Prior Publication Data

US 2023/0103437 A1  Apr. 6, 2023

(51) Int. Cl.
| H10D 30/67 | (2025.01) |
| H01L 21/02 | (2006.01) |
| H10D 30/01 | (2025.01) |
| H10D 64/01 | (2025.01) |

(52) U.S. Cl.
CPC ..... *H10D 30/6713* (2025.01); *H01L 21/0259* (2013.01); *H10D 30/014* (2025.01); *H10D 30/031* (2025.01); *H10D 30/6729* (2025.01); *H10D 30/6735* (2025.01); *H10D 30/6757* (2025.01); *H10D 64/017* (2025.01)

(58) Field of Classification Search
CPC ......... H01L 29/78618; H01L 29/41733; H01L 29/42392; H01L 29/66545; H01L 29/78696; H01L 21/823481; H01L 29/0673; H01L 29/775; B82Y 10/00

USPC .......................................................... 257/347
See application file for complete search history.

(56) References Cited

U.S. PATENT DOCUMENTS

| 9,947,804 B1 | 4/2018 | Frougier et al. |
| 9,984,936 B1 | 5/2018 | Xie et al. |
| 10,032,867 B1 | 7/2018 | Yeung et al. |
| 10,103,238 B1 | 10/2018 | Zang et al. |
| 10,177,037 B2 | 1/2019 | Zang et al. |
| 10,510,620 B1 | 12/2019 | Chanemougame et al. |
| 10,832,916 B1 * | 11/2020 | Xie ................. H01L 21/823437 |
| 10,840,329 B1 | 11/2020 | Xie et al. |
| 10,998,234 B2 | 5/2021 | Xie et al. |
| 2012/0141799 A1 | 6/2012 | Kub et al. |
| 2019/0295898 A1 | 9/2019 | Xie et al. |
| 2020/0365687 A1 * | 11/2020 | Xie ..................... H01L 27/0886 |
| 2022/0068725 A1 * | 3/2022 | Chan ................ H01L 21/76283 |
| 2022/0102509 A1 * | 3/2022 | Lin ....................... H01L 27/088 |

FOREIGN PATENT DOCUMENTS

| AU | 2007222162 B2 | 3/2013 |
| CN | 108156828 A | 6/2018 |
| JP | 5586233 B2 | 9/2014 |
| KR | 10-1374090 B1 | 3/2014 |

* cited by examiner

*Primary Examiner* — Nduka E Ojeh
*Assistant Examiner* — Laura M Dykes
(74) *Attorney, Agent, or Firm* — Samuel A. Waldbaum

(57) ABSTRACT

Embodiments are disclosed for a system. The system includes a semiconductor structure. The semiconductor structure includes a dielectric liner that wraps around a top and one side of a substrate island. The dielectric liner separates a substrate from a gate stack. Further, the system includes an access trench in physical contact with the dielectric liner.

16 Claims, 19 Drawing Sheets

LATE REPLACEMENT BOTTOM ISOLATION FOR NANOSHEET DEVICES

BACKGROUND

The present disclosure relates to late replacement bottom isolation, and more specifically, late replacement bottom isolation for nanosheet devices.

Modern integrated circuits, such as microprocessors, storage devices and the like, may have a relatively large number of circuit elements, such as transistors, that occupy a limited chip area. Additionally, transistors come in a variety of shapes and forms, such as, planar transistors, field effect transistors (FET), and fin field effect transistors (FinFETS).

A conventional, or planar, FET is a device where the entire channel region of the device forms parallel to, and below, the planar upper surface of the semiconducting substrate. In contrast to a planar FET, a FinFET device has a three-dimensional structure. Currently, one type of device that shows promise for more advanced integrated circuit products in new scales of small computing devices is the nanosheet device.

SUMMARY

Embodiments are disclosed for a system. The system includes a semiconductor structure. The semiconductor structure includes a dielectric liner that wraps around a top and one side of a substrate island. The dielectric liner separates a substrate from a gate stack. Further, the system includes an access trench in physical contact with the dielectric liner.

Embodiments are additionally disclosed for a method. The method includes forming a sacrificial liner that wraps around a substrate. The method also includes forming a source/drain (S/D) epitaxy buffer over the sacrificial liner. The method further includes generating the S/D epitaxy over the S/D epitaxy buffer. Additionally, the method includes forming an access trench to the sacrificial liner. Also, the method includes removing the sacrificial liner to form a plurality of cavities.

Further aspects of the present disclosure are directed toward methods and computer program products with functionality similar to the functionality discussed above regarding the computer-implemented method. The present summary is not intended to illustrate each aspect of, every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
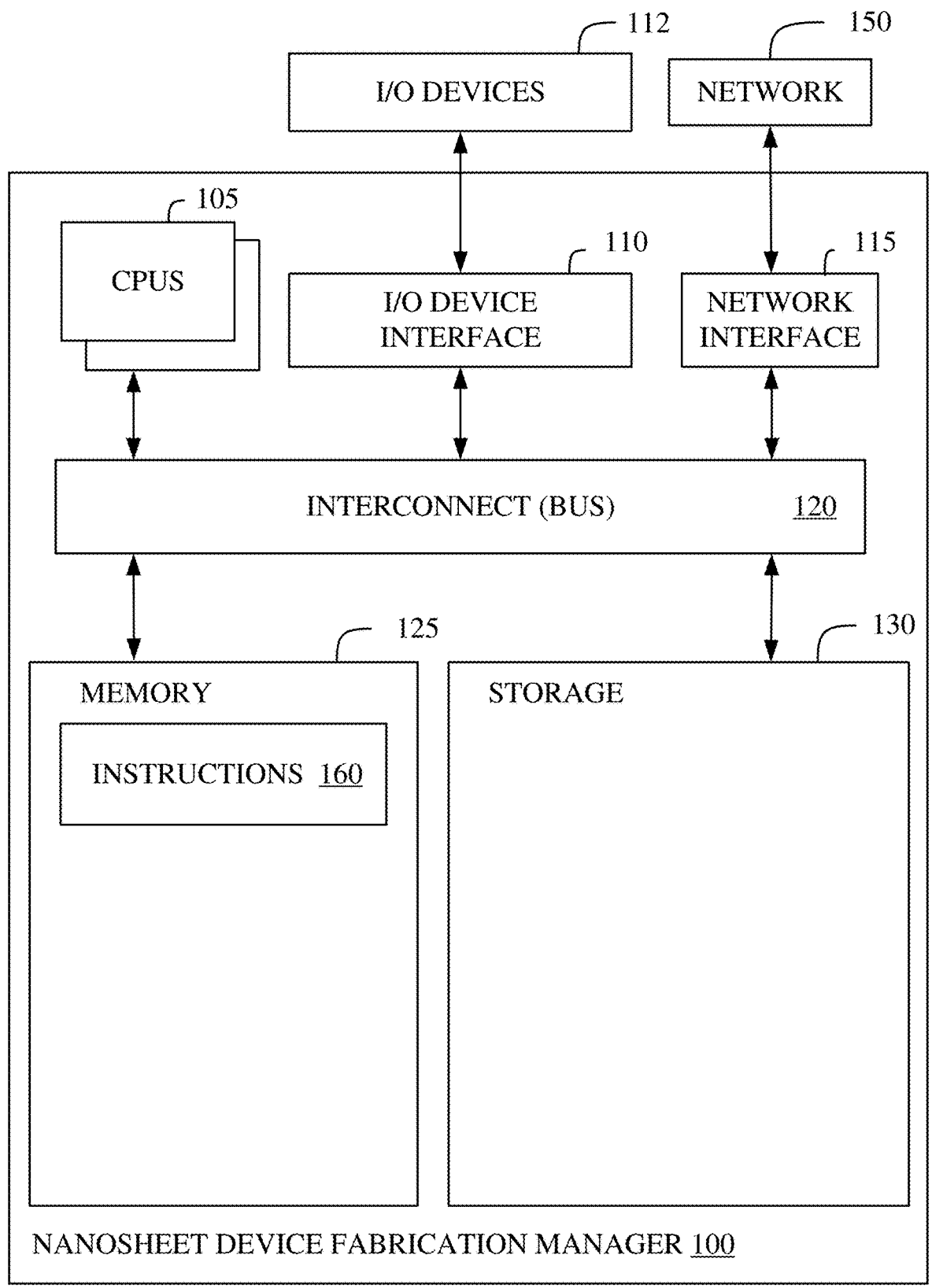
FIG. 1 is a block diagram of an example nanosheet device fabrication manager, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the embodiments described. On the contrary, the intention is to cover all modifications, equivalents, and alternatives falling within the spirit and scope of the present disclosure.

DETAILED DESCRIPTION

As stated previously, integrated circuits, such as microprocessors, may have a relatively large number of circuit elements, such as transistors in a limited chip area. The transistors can be n-type metal-oxide semiconductor NMOS field-effect transistors (NFET) or p-type metal-oxide semiconductor (PMOS) FET (PFET) type devices wherein the "N" and "P" designation depends on the type of dopants used in creating the source/drain regions of the devices.

Complementary metal oxide semiconductor (CMOS) technology refers to integrated circuit products that use both NMOS and PMOS transistor devices. Irrespective of the physical configuration of the transistor device, each transistor device includes laterally spaced apart drain and source regions in a semiconductor substrate; a gate electrode structure positioned above the substrate and between the source/drain regions; and a gate insulation layer positioned between the gate electrode and the substrate. Accordingly, upon application of an appropriate control voltage to the gate electrode, a conductive channel region forms between the drain region and the source region and current flows from the source region to the drain region.

As stated previously, one type of device that shows promise for more advanced integrated circuit products is the nanosheet device. In general, a nanosheet device has a fin-type channel structure that is comprised of multiple, vertically spaced-apart sheets of semiconductor material. Further, a gate structure for the device is positioned around each of these spaced-apart layers of channel semiconductor material. Such a nanosheet device may form part of a high speed logic circuit. Typically, the nanosheet device may operate at a relatively low voltage, e.g., 1 V or less (based on today's technology), and designed for relatively high-speed operation and low-power consumption. These features are useful in limited-power, hand-held, mobile devices, like smartphones, which may include such nanosheet devices.

While nanosheet devices provide advantages, there is still a constant demand to improve the functionality of integrated circuit products, which may involve forming more complex circuitry. To produce such integrated circuit products, it may be useful for product designers to have transistor devices that exhibit different operational characteristics, such as threshold voltages, off-state leakage current, power consumption during operation, and the like. Such devices give product designers more flexibility and options when it comes to designing the circuits for such products.

As noted above, transistor devices include a gate structure. The gate structure can include at least one gate insulation layer and one or more layers of conductive material, such as metal (or, metal-containing layers). The gate insulation layer can include a high-k material, such as, silicon dioxide. High-k materials may be materials having a k value greater than 10. The metal-containing layers may include a work-function adjusting layer, for example, that functions as the conductive gate electrode for the transistor. The materials for the gate structure may differ based on the type of device under construction (e.g., N-type or P-type). Additionally, the number of layers of material that collectively define the gate structure may be different for different types of devices.

Various operational characteristics of a transistor device, such as threshold voltage, leakage currents, etc., may be controlled by adjusting the number, composition, and/or thickness of one or more of the layers of material that collectively define the gate structure or gate stack. For example, to produce a device that exhibits low leakage currents, it may be useful to form the transistor with a relatively thick gate insulation layer. However, as device dimensions continue to shrink, the physical size of the space that the gate structure occupies also continues to shrink, for nanosheet and other devices. As such, it is becoming more challenging to physically fit all of the materials for the gate structure in the remaining physical space. Additionally, the relatively small size of the physical space for the gate structure on a nanosheet device may reduce the options available to a device designer to produce devices with the operational characteristics, such as higher performance and lower power consumption.

Further, fabricating nanosheet devices can involve a source/drain (S/D) epitaxial growth process, which involves growing semiconductor S/D epitaxy from exposed semiconductor surface. However, epitaxial growth from sidewalls of nanosheets can lead to defects, and relatively high variation. As such, some nanosheets may have missing epitaxy.

Accordingly, some embodiments of the present disclosure may fabricate a semiconductor structure that includes a dielectric liner that wraps around the top and one side of the substrate island, thus separating the substrate from the gate stack. Additionally, a gate cut pillar or S/D cut pillar may touch the dielectric liner. Accordingly, some embodiments of the present disclosure may provide nanosheet devices that incorporate the materials of the gate structures in constrained physical spaces, while mitigating defects from epitaxial growth from the sidewalls of the nanosheets. In this way, some embodiments of the present disclosure may improve nanosheet device technology by facilitating the fabrication of devices that can incorporate more complex circuitry in relatively smaller spaces, that still provide the performance advantages of integrated circuit products that incorporate such devices.

FIG. 1 is a block diagram of an example nanosheet device fabrication manager 100, in accordance with some embodiments of the present disclosure. In various embodiments, the example nanosheet device fabrication manager 100 can perform the method described in FIG. 3 and/or the functionality discussed in FIGS. 1, 2, and 4A-4P. In some embodiments, the example nanosheet device fabrication manager 100 provides instructions for the aforementioned methods and/or functionalities to a client machine such that the client machine executes the method, or a portion of the method, based on the instructions provided by the example nanosheet device fabrication manager 100. In some embodiments, the example nanosheet device fabrication manager 100 comprises software executing on hardware incorporated into a plurality of devices.

The example nanosheet device fabrication manager 100 includes a memory 125, storage 130, an interconnect (e.g., BUS) 120, one or more CPUs 105 (also referred to as processors 105 herein), an I/O device interface 110, I/O devices 112, and a network interface 115.

Each CPU 105 retrieves and executes programming instructions stored in the memory 125 or the storage 130. The interconnect 120 is used to move data, such as programming instructions, between the CPUs 105, I/O device interface 110, storage 130, network interface 115, and memory 125. The interconnect 120 can be implemented using one or more busses. The CPUs 105 can be a single CPU, multiple CPUs, or a single CPU having multiple processing cores in various embodiments. In some embodiments, a CPU 105 can be a digital signal processor (DSP). In some embodiments, CPU 105 includes one or more 3D integrated circuits (3DICs) (e.g., 3D wafer-level packaging (3DWLP), 3D interposer based integration, 3D stacked integrated circuits (3D-SICs), monolithic 3D integrated circuits, 3D heterogeneous integration, 3D system in package (3DSiP), and/or package on package (PoP) CPU configurations). Memory 125 is generally included to be representative of a random access memory (e.g., static random access memory (SRAM), dynamic random access memory (DRAM), or Flash). The storage 130 is generally included to be representative of a non-volatile memory, such as a hard disk drive, solid state device (SSD), removable memory cards, optical storage, and/or flash memory devices. Additionally, the storage 130 can include storage area-network (SAN) devices, the cloud, or other devices connected to the example nanosheet device fabrication manager 100 via the I/O device interface 110 or to a network 150 via the network interface 115.

In some embodiments, the memory 125 stores instructions 160. However, in various embodiments, the instructions 160 are stored partially in memory 125 and partially in storage 130, or they are stored entirely in memory 125 or entirely in storage 130, or they are accessed over a network 150 via the network interface 115.

Figure 2:
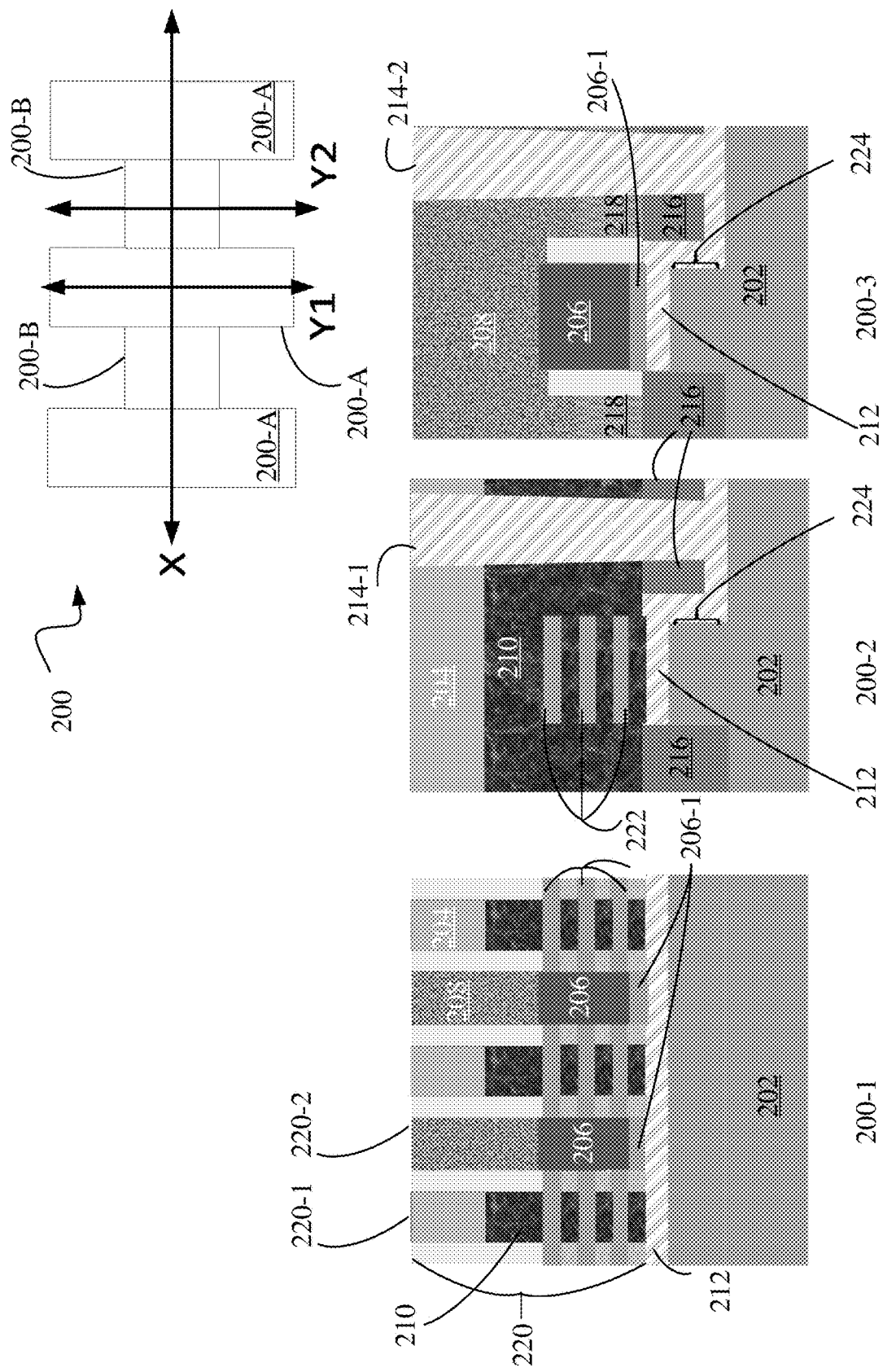
FIG. 2 is a block diagram of the top view of an example nanosheet device and side views of the nanosheet device with respect to cross-sectional views in accordance with some embodiments of the present disclosure.
Figure 3:
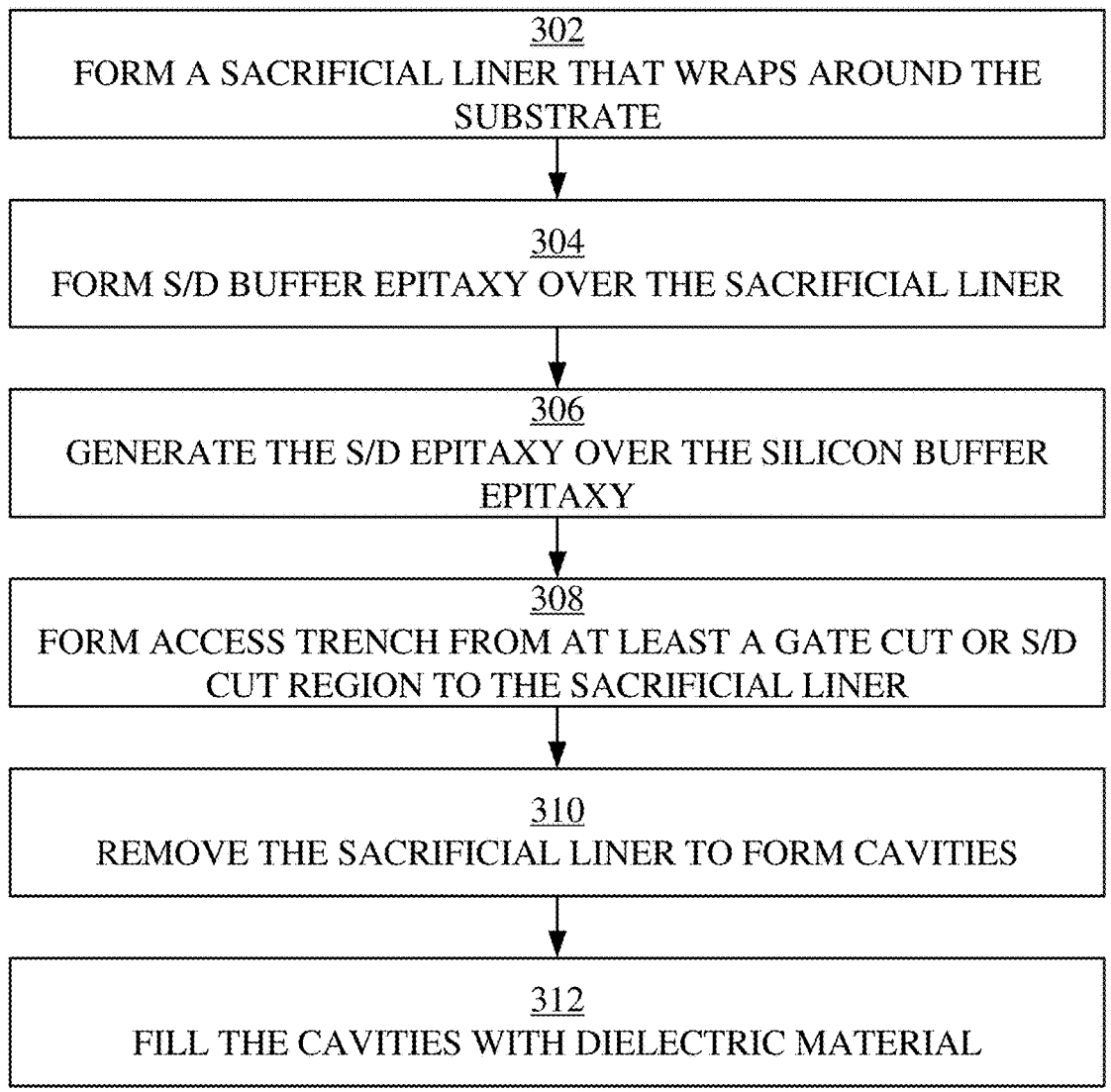
FIG. 3 is a process flow chart of a method for late replacement bottom isolation for nanosheet devices, in accordance with some embodiments of the present disclosure.
Figure 4A:
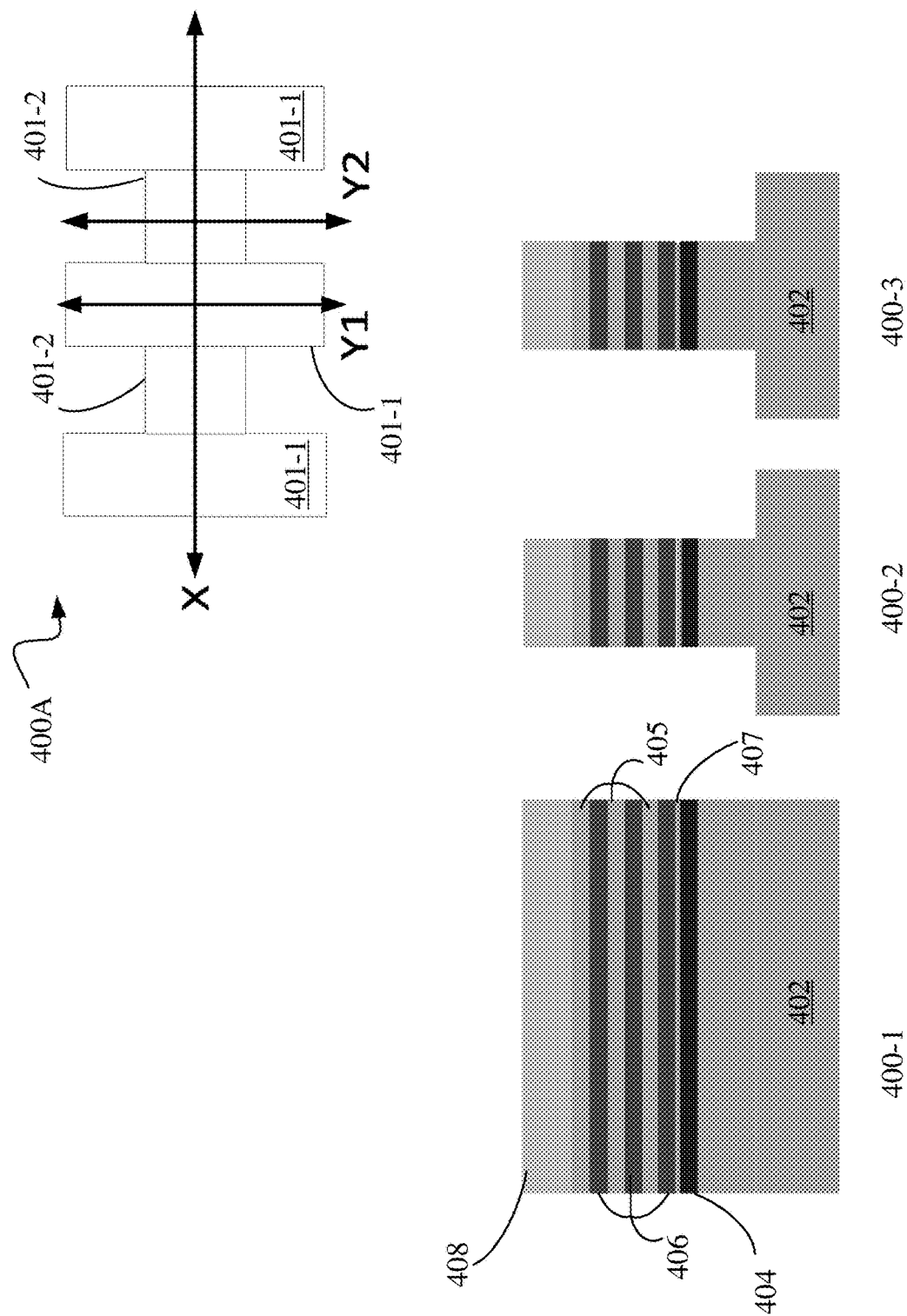
FIGS. 4A, 4B, 4C, 4D, 4E, 4F, 4G, 4H, 4I, 4J, 4K, 4L, 4M, 4N, 4O, and 4P are block diagrams of the top views and cross-sectional views of example nanosheet devices, in accordance with some embodiments of the present disclosure.
Figure 4B:
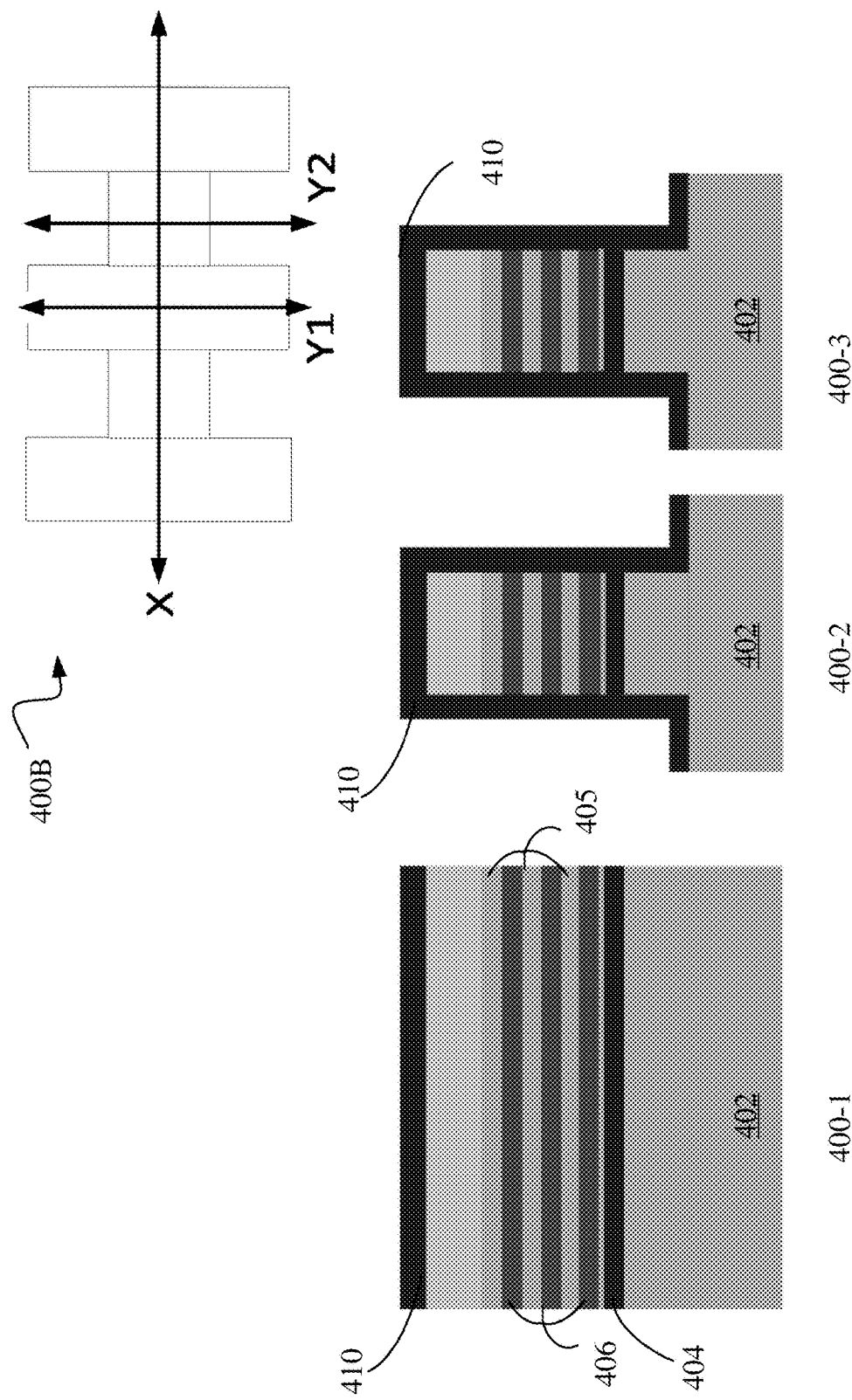
Figure 4C:
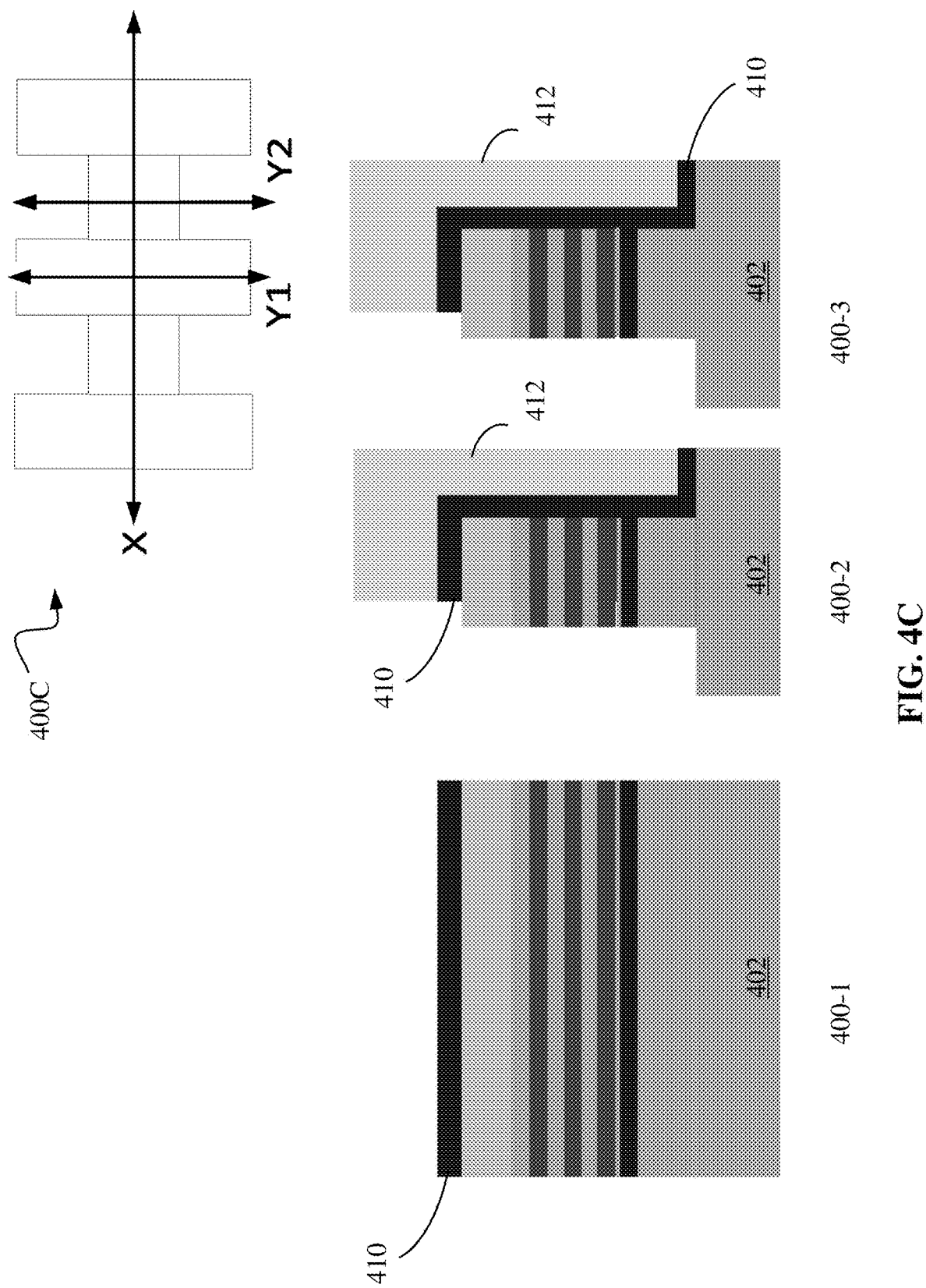
Figure 4D:
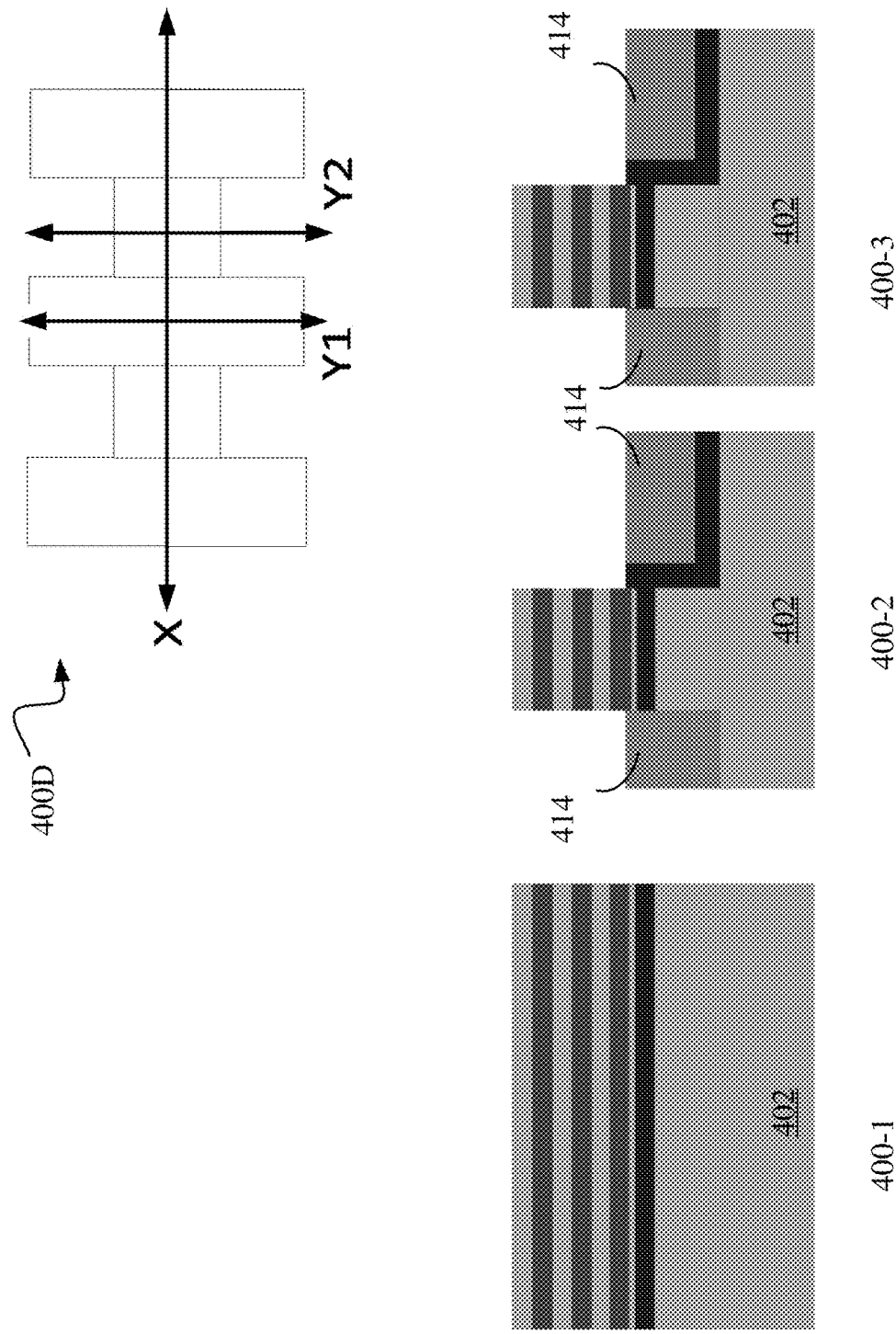
Figure 4E:
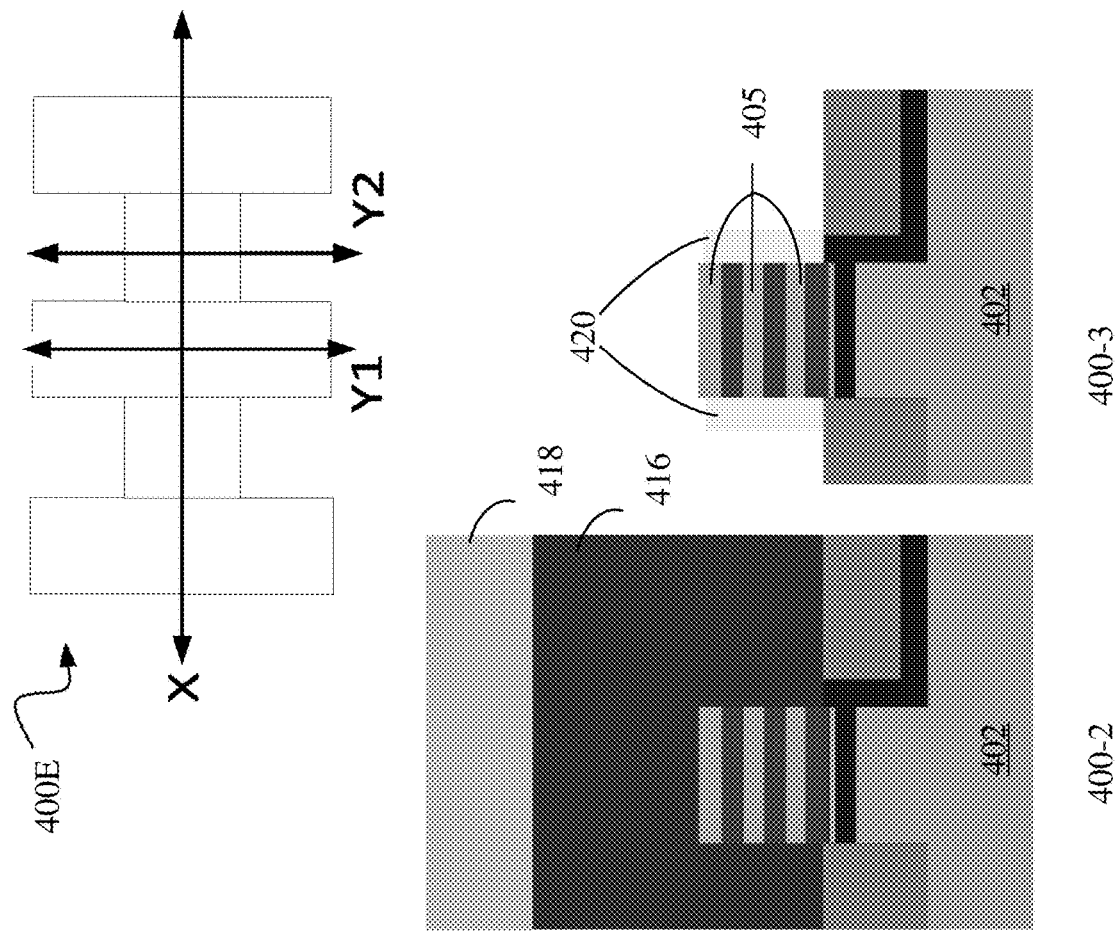
Figure 4E:
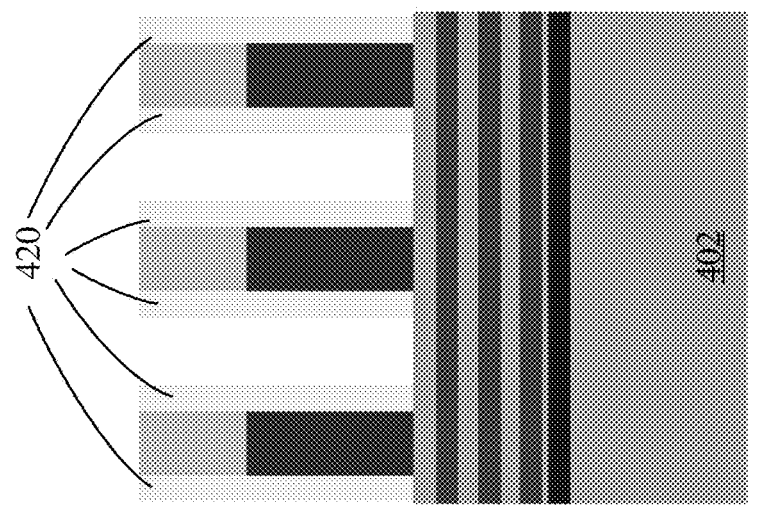
Figure 4F:
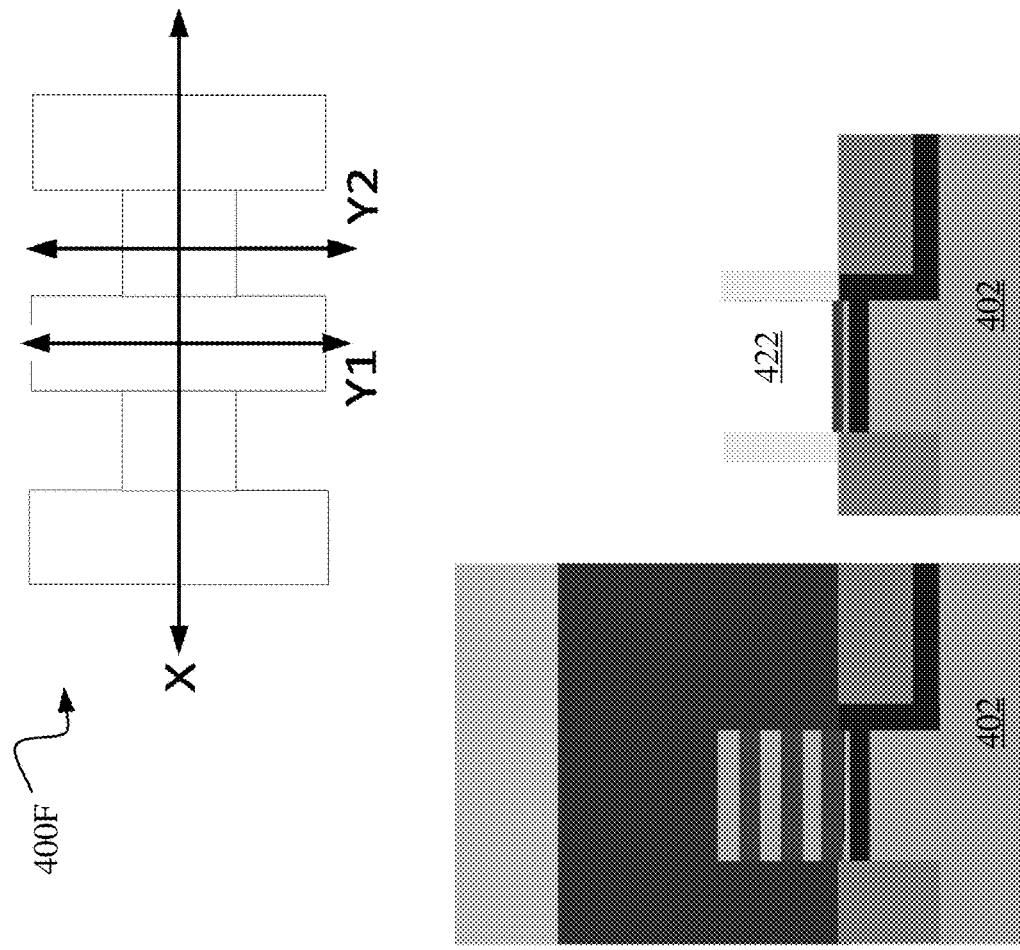
Figure 4G:
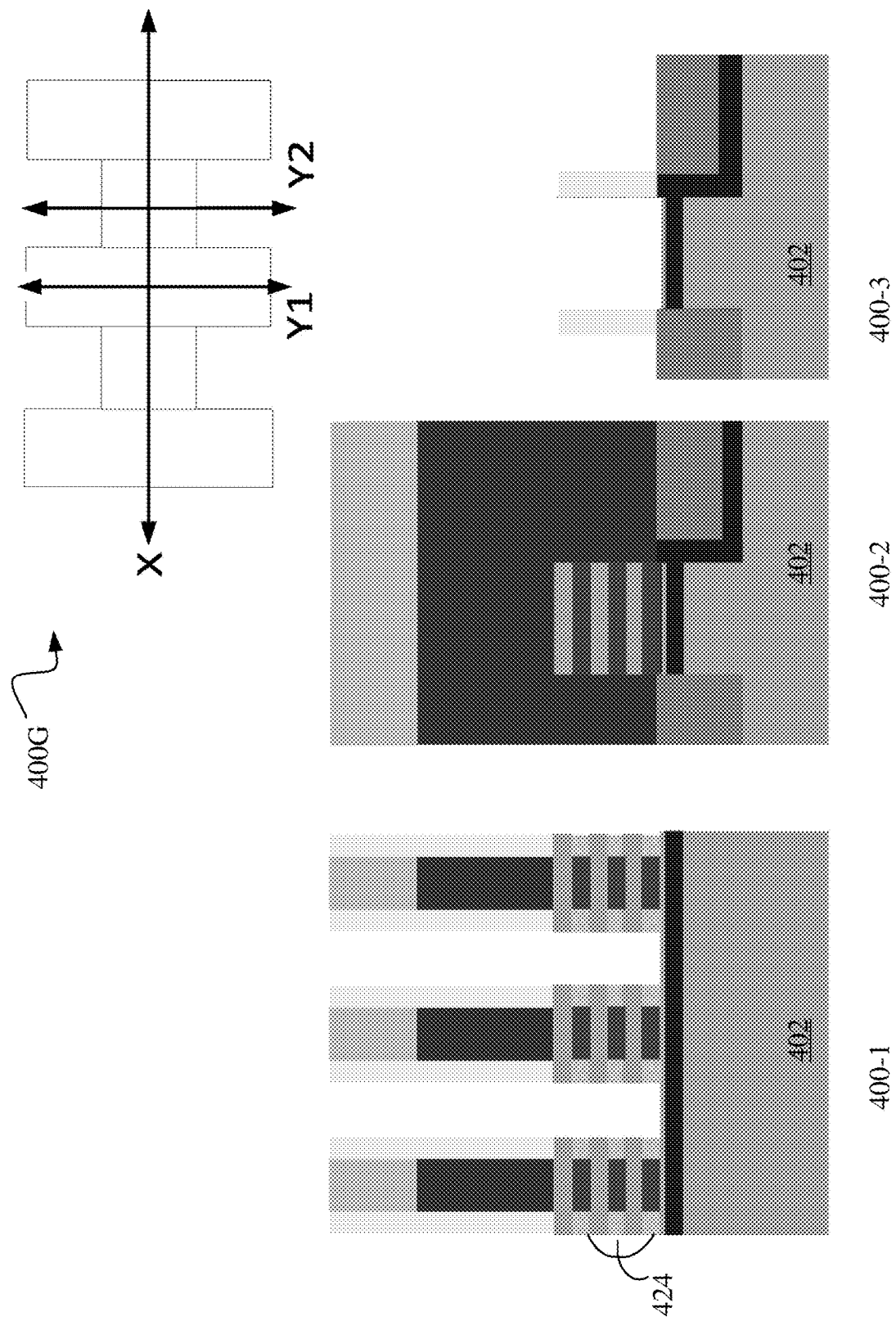
Figure 4H:
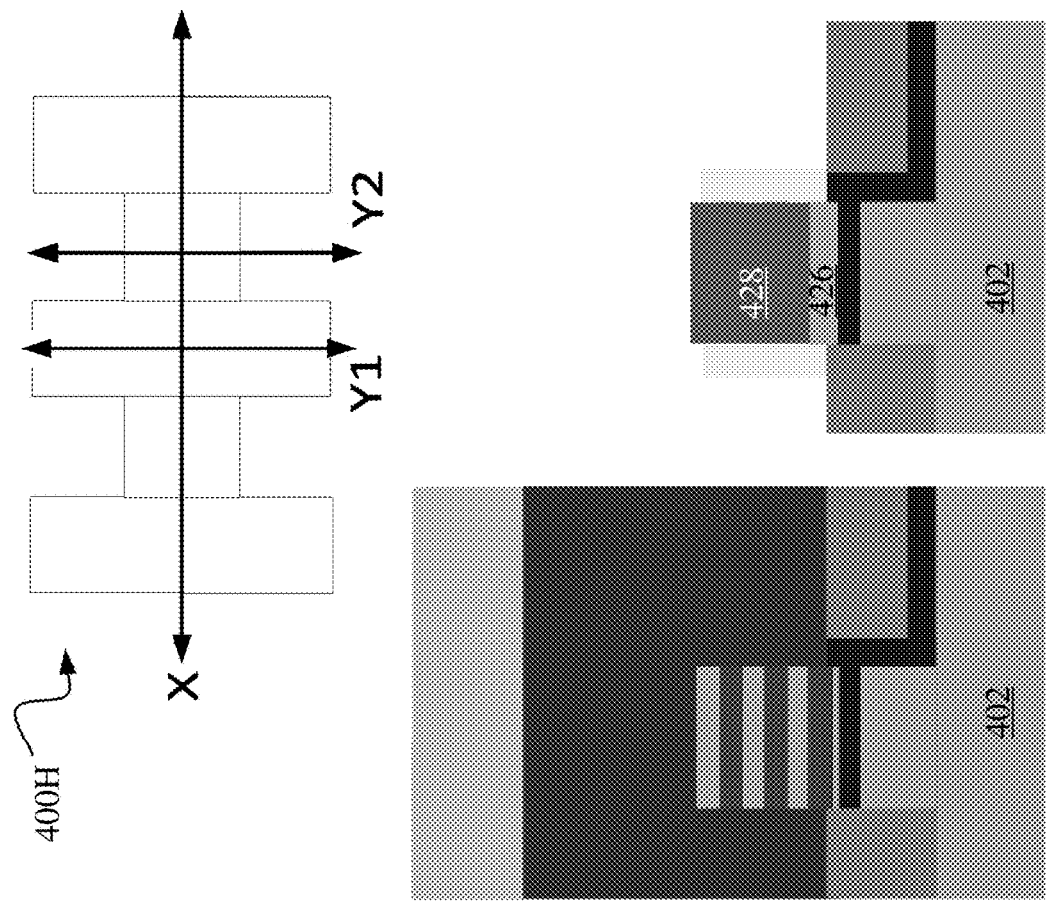
Figure 4I:
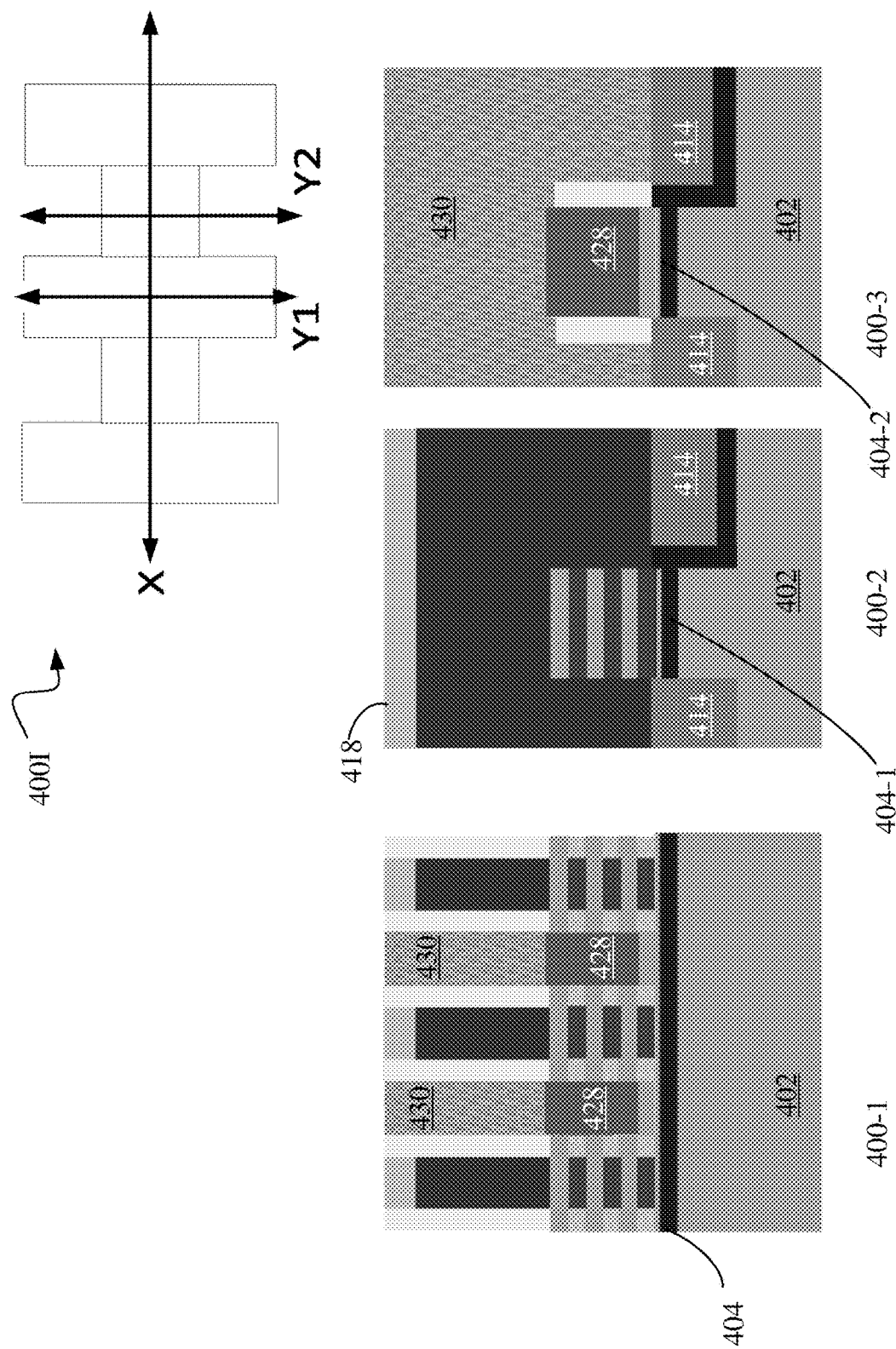
Figure 4J:
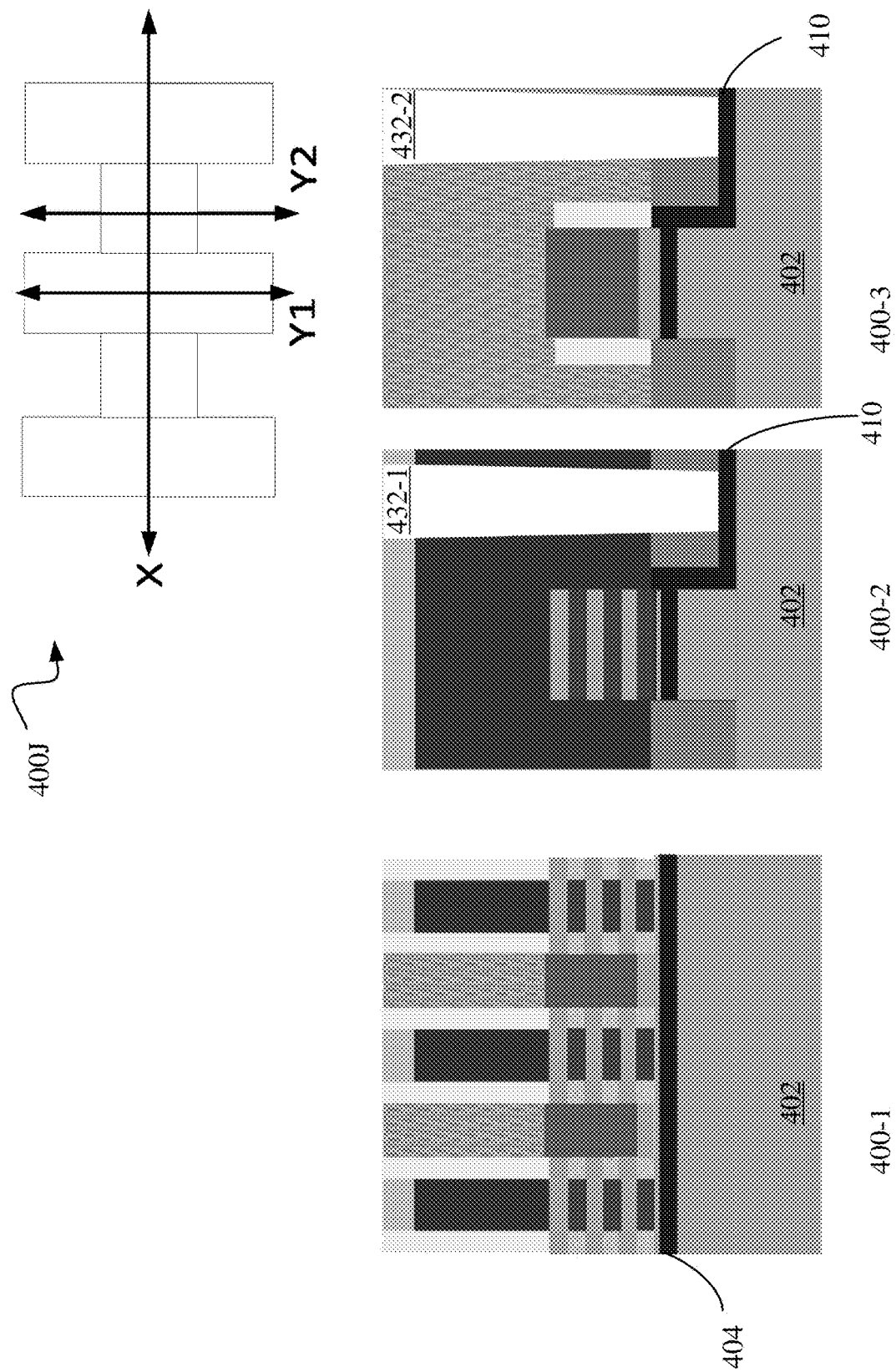
Figure 4K:
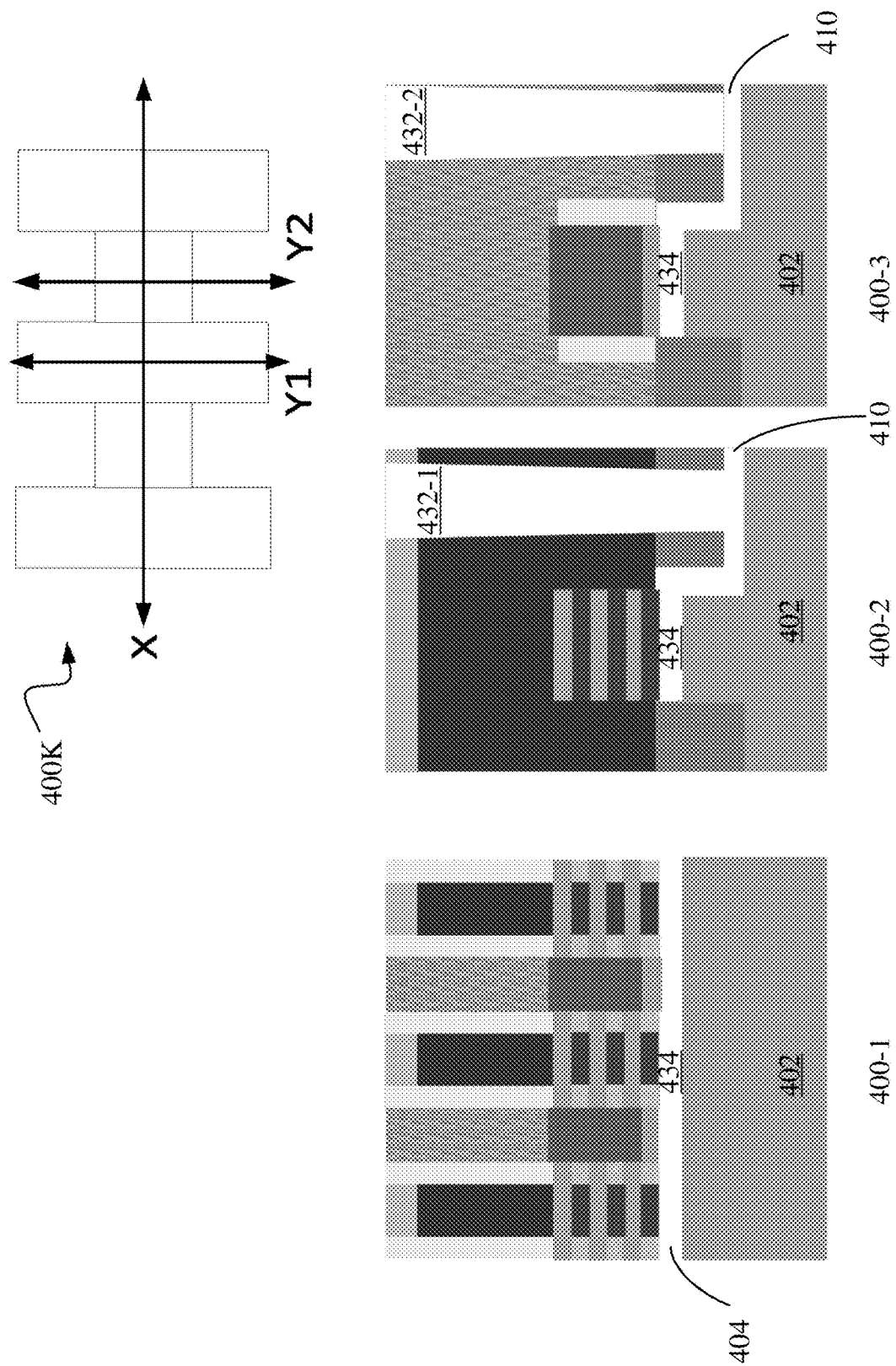
Figure 4L:
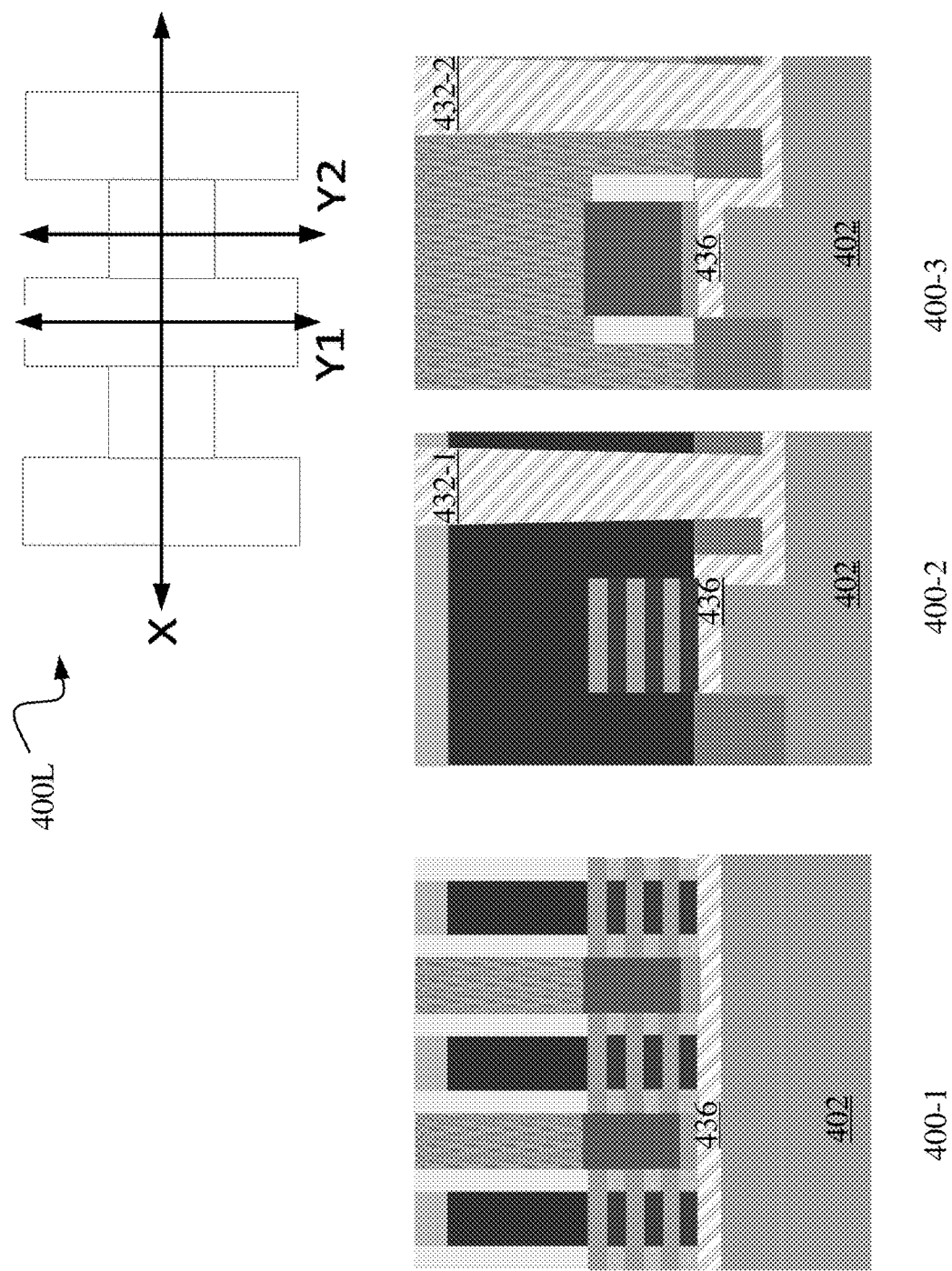
Figure 4M:
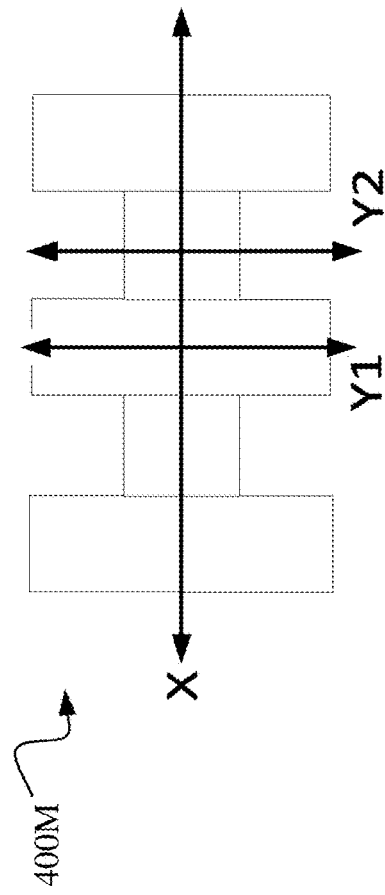
Figure 4M:
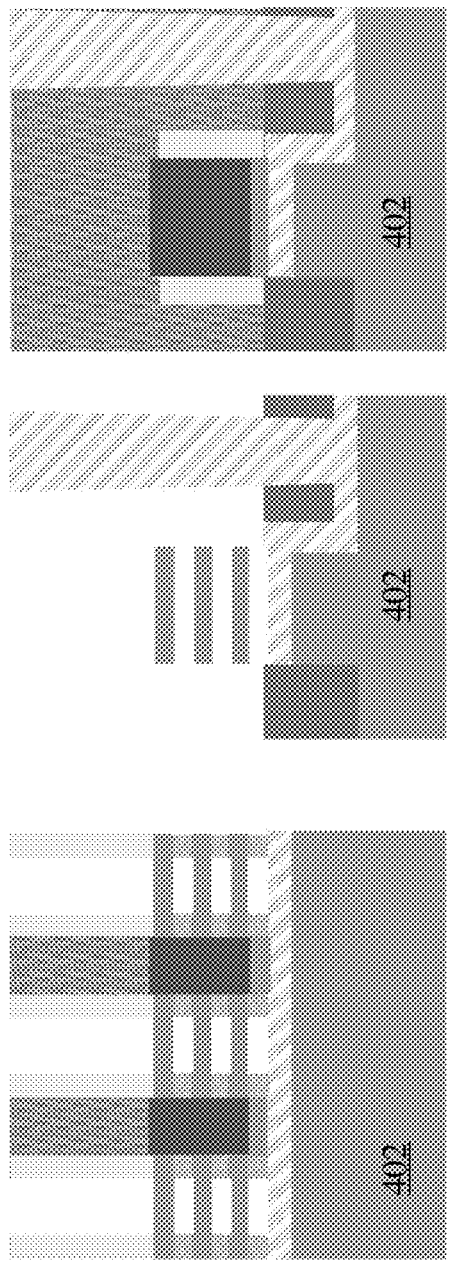
Figure 4N:
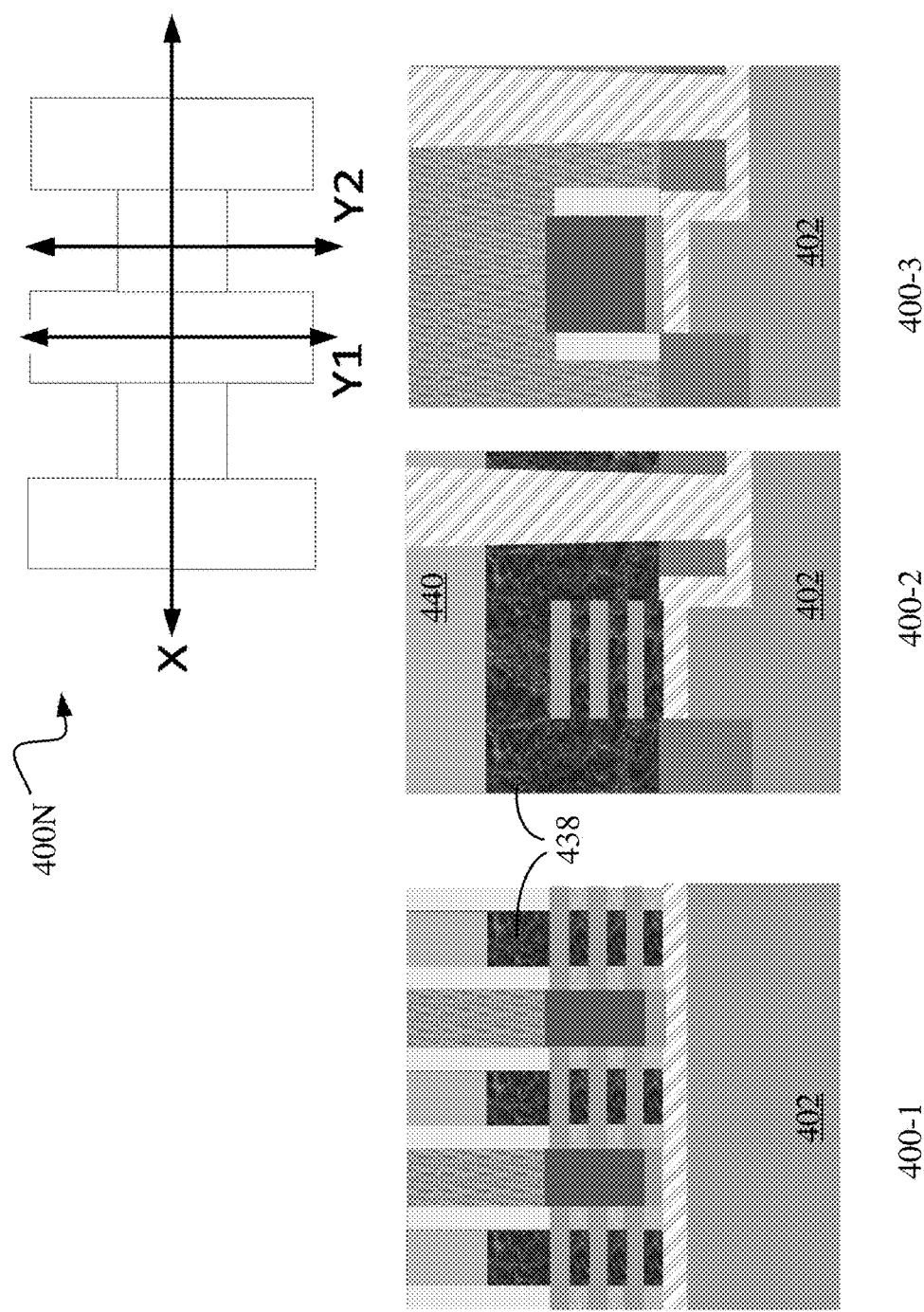
Figure 4O:
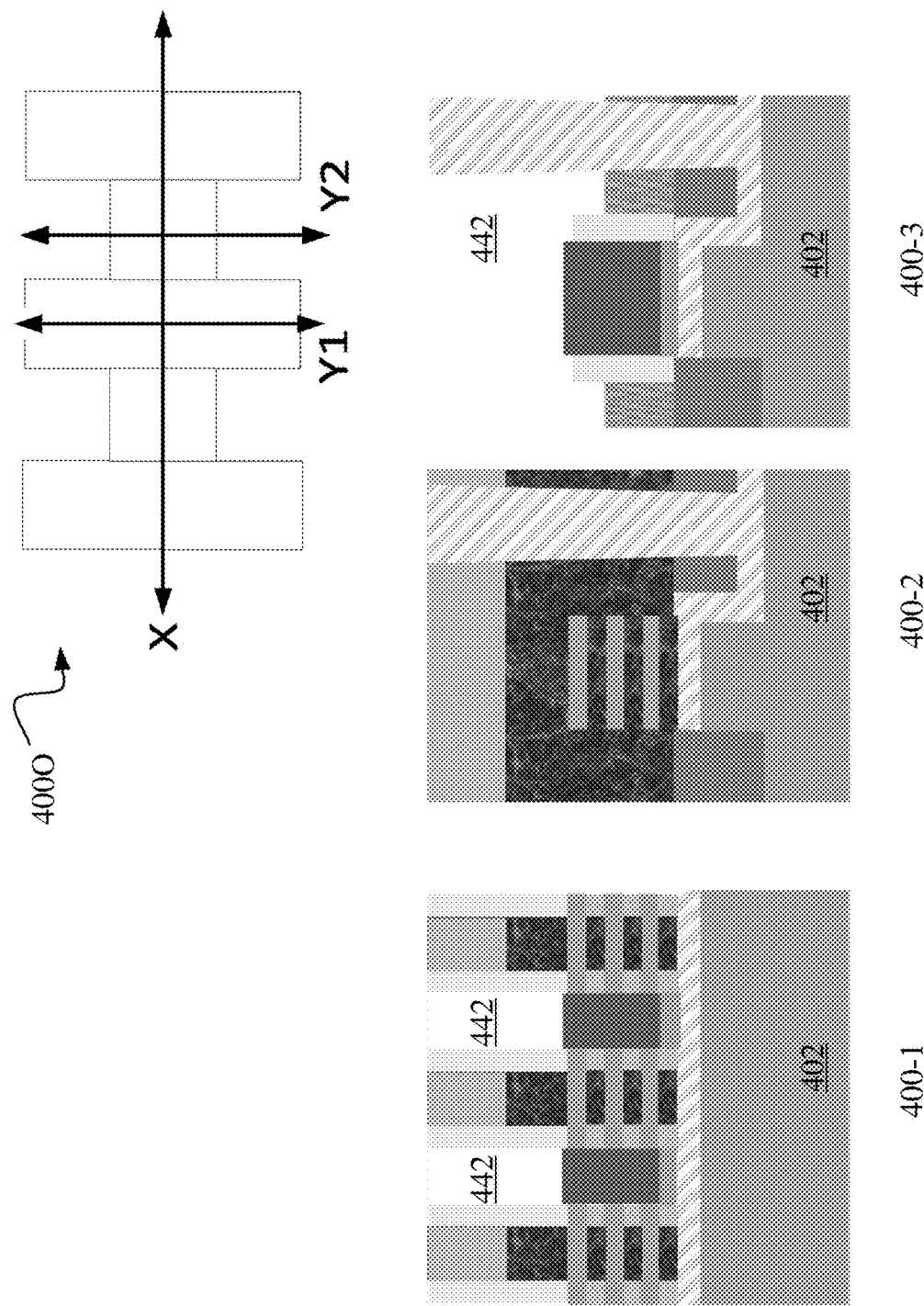
Figure 4P:
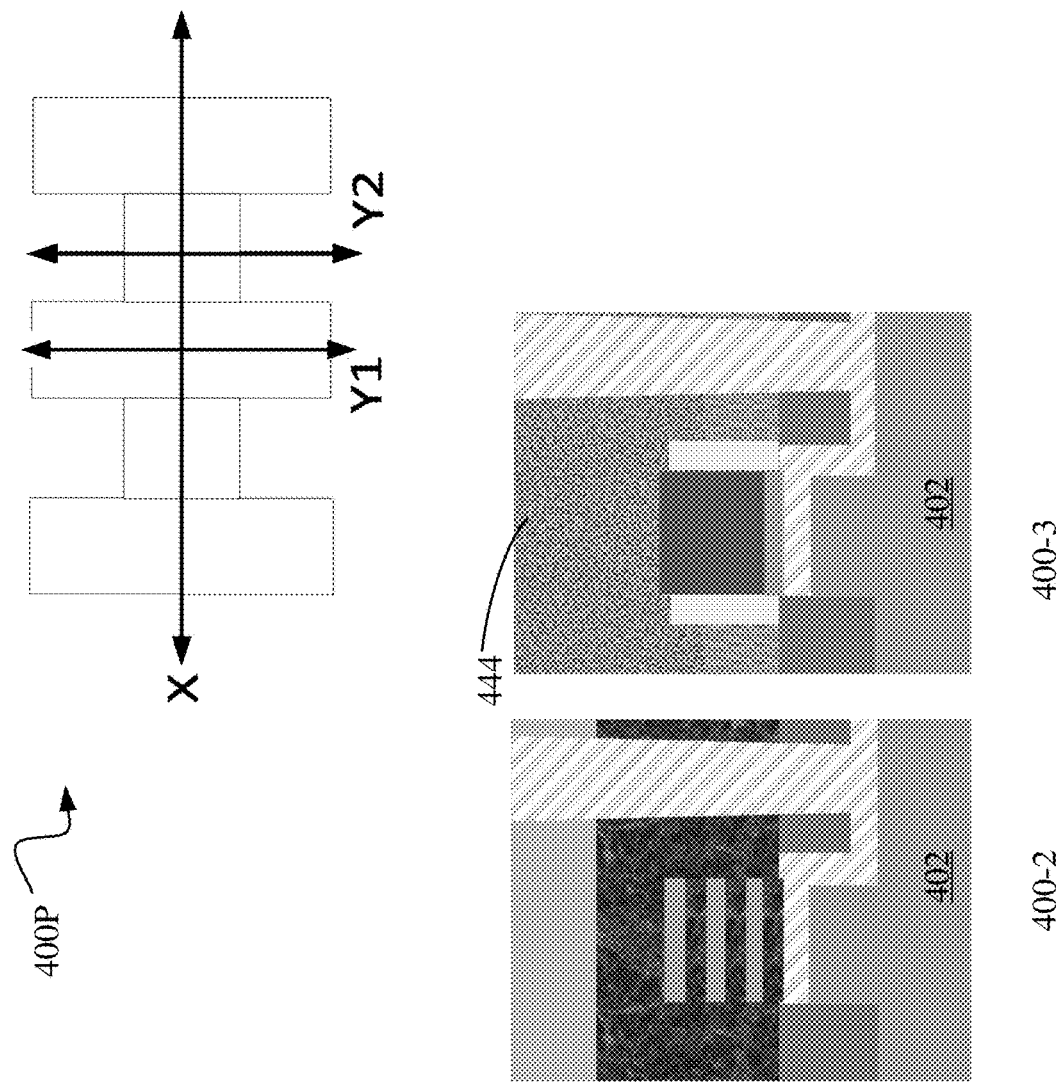
Figure 4P:
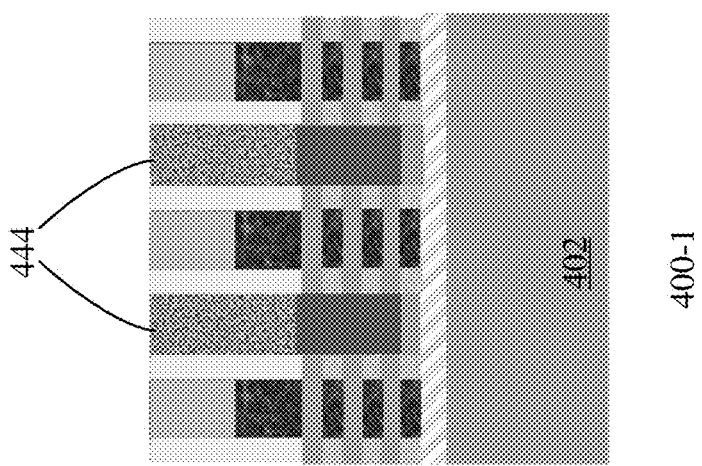

Instructions 160 can be processor-executable instructions for performing any portion of, or all, any of the method described in FIG. 3 and/or the functionality discussed in FIGS. 2, 4A-4P.

In various embodiments, the I/O devices 112 include an interface capable of presenting information and receiving input. For example, I/O devices 112 can present information to a listener interacting with example nanosheet device fabrication manager 100 and receive input from the listener.

The example nanosheet device fabrication manager 100 is connected to the network 150 via the network interface 115. Network 150 can comprise a physical, wireless, cellular, or different network.

In some embodiments, the example nanosheet device fabrication manager 100 can be a multi-user mainframe computer system, a single-user system, or a server computer or similar device that has little or no direct user interface but receives requests from other computer systems (clients). Further, in some embodiments, the example nanosheet device fabrication manager 100 can be implemented as a desktop computer, portable computer, laptop or notebook computer, tablet computer, pocket computer, telephone, smart phone, network switches or routers, or any other appropriate type of electronic device.

It is noted that FIG. 1 is intended to depict the representative major components of an example nanosheet device fabrication manager 100. In some embodiments, however, individual components can have greater or lesser complexity than as represented in FIG. 1, components other than or in addition to those shown in FIG. 1 can be present, and the number, type, and configuration of such components can vary.

FIG. 2 is a block diagram of the top view of an example nanosheet device 200 and side views of the nanosheet device 200 with respect to cross-sectional views 200-1, 200-2, 200-3, in accordance with some embodiments of the present disclosure. The example nanosheet device 200 includes gates 200-A and active region 200-B as shown in cross-sectional views 200-1, 200-2, 200-3. The example nanosheet device 200 is shown along two-dimensional coordinate axes in the x and y directions, specifically, X, Y1, and Y2. These X, Y1, and Y2 axes serve as the respective side views shown below the example nanosheet device 200 for each of the respective cross-sectional views 200-1, 200-2, 200-3. The cross-sectional views 200-1 through 200-3 may be similarly configured, collective stacks of semiconductor components, described in more detail below.

The cross-sectional view along the X-axis, cross sectional view 200-1, shows multiple pillars 220 of semiconductor components, separated from the substrate 202 by a bottom dielectric isolation (BDI) layer 212. The substrate 202 can be made from silicon, for example, and serves as a substrate of the nanosheet device 200. The BDI layer 212 can be a dielectric layer disposed between the substrate 202 and the pillars 220 of the nanosheet device 200. In this way, the BDI layer 212 can improve the nanosheet device performance by mitigating current leakage through the substrate 202 and reducing the parasitic capacitances.

Further, the pillars 220 include alternating gate pillars 220-1 and S/D pillars 220-2. From the cross-sectional view 200-1, the gate pillars 220-1 include a gate dielectric cap 204, and high-k metal gates 210 which wrap around nanosheet channels 222. The gate dielectric cap 204 can be a protecting layer that prevents the S/D contact from being short to gate. The nanosheet channels 222 are the channel regions of the device controlled by high-k metal gates 210. The high-k metal gates 210 can include the gate dielectric, workfunction metals and conductive metal fills.

As stated previously, the cross-sectional views 200-1 through 200-3 may be similarly configured. As such, the cross-sectional view along the Y1-axis, cross-sectional view 200-2, shows the cross-sectional structure along the gate regions (e.g., gate pillars 220-1). Similarly, cross-sectional view 200-3 shows the cross-sectional structure along the S/D regions (e.g., S/D pillars 220-2) from the perspective of the Y2-axis.

The cross-sectional view 200-2 shows the substrate 202, gate cap 204, high-k metal gates 210, nanosheet channels 222, BDI layer 212, access trench 214-1, and shallow trench isolation (STI) 216. According to some embodiments of the present disclosure, a fabrication tool may cut the gate (e.g., S/D pillar 220-2), thus forming the access trench 214-1. In this way, the access trench 214-1 provides access to the BDI layer 212. The access trench 214-1 is also referred to as gate cut and dielectric pillar. Further, the fabrication tool can fill the BDI layer 212 and gate cut with dielectric material. In this way, the nanosheet device 200 may mitigate parasitic capacitance between the high-k metal gates 210 and substrate 202. The STI 216 can be a trench into the substrate 202 that is filled with a dielectric material that isolates the active regions between different nanosheet devices.

Similarly, the cross-sectional view 200-3 shows the substrate 202 and STI 216. However, as stated previously, cross-sectional view 200-3 shows the cross-sectional structure along the S/D pillars 220-2. The cross-sectional view 200-3 thus shows a layer of S/D epitaxy buffer 206-1 between the BDI layer 212 and an S/D epitaxy 206. The S/D epitaxy 206 can be a film that forms over the S/D epitaxy buffer layer 206-1 by epitaxy growth. This film may include heavily doped semiconductor layers, such as B doped silicon germanium (SiGe) or P-doped silicon (Si). Additionally, the cross-sectional view 200-3 shows the contacts 208. The contacts 208 can be electric contacts for the nanosheet device 200.

Further, the cross-sectional view 200-3 shows the access trench 214-2 and inter-level dielectric (ILD) 218. The access trench 214-2 is also referred to as a dielectric pillar, S/D gate cut, and S/D contact cut. The S/D contact cut refers to a dielectric region that separates contacts 208 between different nanosheet devices, e.g., neighboring S/D pillars 220-2. The access trenches 214-1, 214-2 are collectively referred to as access trenches 214. According to some embodiments of the present disclosure, the fabrication tool may cut the contact 208, thus forming access trench 214-2, which may land over the BDI layer 212. Accordingly, the BDI layer 212 and access trench 214 can provide a dielectric liner that wraps around the top and one side of the substrate islands 224, thus separating the substrate, e.g., substrate 202, from the high-k metal gates 210 and S/D epitaxy 206.

Additionally, the ILD 218 may be a dielectric material with a low-k constant (e.g., k=3.9 or less) that electrically separates relatively close interconnect lines arranged in several levels. The low k dielectric material can mitigate capacitive coupling between neighboring interconnect lines.

Accordingly, some embodiments of the present disclosure can mitigate parasitic capacitance between gates and substrate. Additionally, such embodiments can improve performance by mitigating current leakage through the substrate 202. Further, such embodiments may mitigate defects from epitaxial growth on the sidewalls of the nanosheet channels 222. Further, the S/D epitaxy 206 can be grown from a relatively high quality layer of S/D epitaxy buffer 206-1, which is grown from bottom sacrificial layers, instead of being grown from sidewalls of exposed nanosheets. Accordingly, the S/D epitaxy quality in some embodiments of the present disclosure represents an improvement over current fabrication techniques for nanosheet devices.

FIG. 3 is a process flow chart of a method 300 for late replacement bottom isolation for nanosheet devices, in accordance with some embodiments of the present disclosure. In some embodiments, an example nanosheet device fabrication manager, such as the example nanosheet device fabrication manager 100 described with respect to FIG. 1, can perform the method 300.

At operation 302, example nanosheet device fabrication manager 100 may direct a fabrication tool to form a sacrificial liner that partially wraps around the substrate. The sacrificial liner may be a material, such as, SiGe60. Accordingly, the example nanosheet device fabrication manager 100 may direct the fabrication tool to form the sacrificial liner (not shown) that covers at least a vertical sidewall of a substrate island and extends under the STI region and under the active region of the nanosheet device (under both channel region and S/D region). The channel and S/D regions are described in greater detail with respect to FIG. 4I.

At operation 304, the example nanosheet device fabrication manager 100 may direct a fabrication tool to form a silicon buffer epitaxy, such as the S/D epitaxy buffer 206-1, over the sacrificial liner. As stated previously, the S/D epitaxy buffer 206-1 can provide an alternative to growing the S/D epitaxy from the sidewall surface of the exposed nanosheets. Accordingly, the fabrication tool may grow a relatively thin (silicon) S/D epitaxy buffer 206-1 on the sacrificial liner.

At operation 306, the example nanosheet device fabrication manager 100 may direct the fabrication tool to generate the S/D epitaxy 206 over the S/D epitaxy buffer 206-1. According to some embodiments of the present disclosure, the fabrication tool may generate the S/D epitaxy 206 by condensing precursors on the S/D epitaxy buffer 206-1. Thus, the fabrication tool may grow the S/D epitaxy 206 on the S/D epitaxy buffer 206-1. In this way, the S/D epitaxy buffer 206-1 may separate the S/D epitaxy 206 from the sacrificial liner.

At operation 308, the example nanosheet device fabrication manager 100 may direct the fabrication tool to form an access trench from a gate cut opening or a contact cut opening to the sacrificial liner. The example nanosheet device fabrication manager 100 may direct the fabrication tool to perform a gate cut or contact cut patterning process, to form the access trench, such as the access trench 214, to expose the underlying sacrificial liner.

At operation 310, the example nanosheet device fabrication manager 100 may direct the fabrication tool to remove the sacrificial liner. Removing the sacrificial liner in this way can form a cavity between the substrate 202 and active regions of nanosheet device 200, including high-k metal gates 210 and S/D epitaxy 206. In this way, the S/D epitaxy buffer 206-1 can help prevent the removal of the sacrificial liner from damaging the S/D epitaxy 206 even though the S/D epitaxy 206 can include similar material as the sacrificial liner.

At operation 312, the example nanosheet device fabrication manager 100 may direct the fabrication tool to fill the cavities with dielectric material. More specifically, the fabrication tool may fill the cavities through the access trench 214 of either the gate cut opening (e.g., access trench 214-1) and/or the S/D contact cut opening (e.g., access trench 214-1). In this way, the dielectric material can fill the BDI layer 212 and the respective access trenches 214.

Further, in performing the method 300, some embodiments of the present disclosure may thus replace the sacrificial liner and form the bottom isolation for nanosheet devices relatively late in the fabrication process. In this way, it may be possible to grow relatively high quality S/D epitaxy 206 (e.g., crystalline semiconductor) over the sacrificial liner relatively early in the process flow of fabrication. Additionally, in a relatively late stage of this process flow, the sacrificial liner can be removed and replaced with the BDI layer 212. Accordingly, the BDI layer 212 may mitigate current leakage through the substrate 202 and reduce parasitic capacitances.

FIGS. 4A through 4P are block diagrams of the top and cross-sectional views of example nanosheet devices 400A through 400P, in accordance with some embodiments of the present disclosure. The example nanosheet devices 400A through 400P include gates 401-1 and active region 401-2, shown in further detail in cross-sectional views 400-1, 400-2, 400-3. The example nanosheet devices 400A through 400P are shown along two-dimensional coordinate axes in the x and y directions, specifically, X, Y1, and Y2. These X, Y1, and Y2 axes serve as the respective views for each of the cross-sectional views 400-1, 400-2, 400-3. As stated previously, the X perspective represents a cross-sectional view across the gates. Further, the cross-sectional views 400-2, 400-3 respectively represent Y1 and Y2 perspectives along the gate and S/D regions.

FIG. 4A is a block diagram of a nanosheet device 400A in fabrication, in accordance with some embodiments of the present disclosure. The fabrication of the nanosheet device 400A may start with a silicon substrate 402. Further, a fabrication tool may grow a nanosheet stack on the silicon substrate 402, and pattern the nanosheet stack. The substrate 402 is similar to the substrate 202 and serves as a substrate of the nanosheet device being fabricated.

Accordingly, the nanosheet device 400A includes the silicon substrate 402 and a nanosheet stack having several epitaxy layers. These nanosheets include, from the bottom to the top of the stack, a sacrificial liner 404, a relatively thin Si layer above sacrificial liner 404, repeating layers of nanosheet channels 405 and sacrificial SiGe layer 407, and a hardmask 408. The silicon substrate 402 may be similar to the substrate 202, described with respect to FIG. 2. The sacrificial liner 404 may serve as a placeholder for a late replacement bottom dielectric isolation, such as the BDI layer 212. In some embodiments of the present disclosure, the sacrificial liner 404 may be a silicon germanium material (SiGe), such as SiGe60 (which may contain 60% germanium). The sacrificial SiGe layer 407 may have a lower percentage of germanium than the sacrificial liner 404. For example, the sacrificial SiGe layer 407 may be composed of SiGe30 (e.g., 30% germanium). The hardmask 408 may be a cap that facilitates nanosheet stack patterning, and forming the sacrificial liner 404 and STI. Forming the sacrificial liner 404 and STI is described in greater detail with respect to FIGS. 4A and 4D.

FIG. 4B is a block diagram of nanosheet device 400B in fabrication, in accordance with some embodiments of the present disclosure. The nanosheet device 400B may represent a result from performing operation 302 on nanosheet device 400A. More specifically, a fabrication tool may perform a conformal deposit of sacrificial material on the nanosheet device 400A, thus connecting a supplementary sacrificial liner 410 with the sacrificial liner 404. The material of the supplementary sacrificial liner 410 can be amorphous, and may not be single crystalline. For example, the supplementary sacrificial liner 410 may be composed of SiGe60, titanium oxide (TiOx), and the like.

FIG. 4C is a block diagram of nanosheet device 400C in fabrication, in accordance with some embodiments of the present disclosure. The nanosheet device 400C may result from a block mask and etch of nanosheet device 400B. More specifically, the fabrication tool may form a block mask 412 on the supplementary sacrificial liner 410. The block mask may be soft mask material, such as a spin-on coating of an organic planarization layer (OPL). After OPL spin-on coating, the fabrication tool may perform a conventional litho patterning and etch process to remove the OPL from one side of the nanosheet stack. Further, the fabrication tool may etch the exposed supplementary sacrificial liner 410 from one side of the nanosheet stack and substrate island.

FIG. 4D is a block diagram of nanosheet device 400D in fabrication, in accordance with some embodiments of the present disclosure. The nanosheet device 400D may result from forming an STI 414 on the nanosheet device 400C. The STI 414 may be similar to the STI 216. STI dielectric is formed by overfilling the space with dielectric material, such as a thin layer of SiN followed SiO2 deposition. After that, a CMP process is performed to remove excessive STI dielectric, stopping on hardmask 408. After that, the STI dielectric is recessed to the level which is substantially co-planar with the bottom surface of sacrificial SiGe30. After that, the exposed supplementary sacrificial liner 410 and hardmask 408 are removed.

FIG. 4E is a block diagram of nanosheet device 400E in fabrication, in accordance with some embodiments of the present disclosure. The nanosheet device 400E may result from dummy gate patterning and spacer formation on nanosheet device 400D. Dummy gate patterning can involve forming dummy gates 416 over the nanosheet stack and STI. Accordingly, the Y2 perspective, which can represent the side view of along the S/D region, does not have dummy gates 416. Spacer formation can involve forming spacers 420 on the dummy gates 416, dummy gate caps 418, and nanosheet stacks 405. The spacers could be any suitable dielectric material (e.g., SiN, SiBCN, SiOCN, SiOC, and the like), formed by a conformal dielectric deposition and followed by anisotropic reactive-ion etching (RIE) to remove the spacer material from horizontal surfaces.

FIG. 4F is a block diagram of nanosheet device 400F in fabrication, in accordance with some embodiments of the present disclosure. The nanosheet device 400F may result from performing a nanosheet recess process on the nanosheet device 400E. The nanosheet recess process can create recesses 422, which can serve as the location for growing the S/D epitaxy. According to some embodiments of the present disclosure, the recess depth may approach the sacrificial SiGe layer 407.

FIG. 4G is a block diagram of nanosheet device 400G in fabrication, in accordance with some embodiments of the present disclosure. The nanosheet device 400G may result from performing an SiGe30 indentation and inner spacer formation on the nanosheet device 400F. The SiGe30 indentation can involve removing the outer edges of the SiGe30 layers. Further the inner spacer formation can involve forming inner spacers 424 in the space previously occupied by the removed outer edges of the SiGe30 layers. The inner spaces 424 can electrically isolate the gate stack (e.g., high k metal gates 438 to be formed later) from the S/D epitaxy.

FIG. 4H is a block diagram of nanosheet device 400H in fabrication, in accordance with some embodiments of the present disclosure. The nanosheet device 400H may result from performing operations 304 and 306 on the nanosheet device 400G. More specifically, the nanosheet device 400H may result from forming a Si buffer epitaxial layer 426 on the nanosheet device 400G. More specifically, the fabrication tool may grow the Si buffer epitaxial layer 426 in the recesses 422 described with respect to FIG. 4F. Further, the nanosheet device 400H may result from growing an S/D epitaxy 428 on the Si buffer epitaxial layer 426. The S/D epitaxy 428 may be composed of a relatively heavily doped S/D epitaxy, such as Si:P or SiGe:B. According to some embodiments of the present disclosure, the epitaxial layers (e.g., Si buffer epitaxial layer 426 and S/D epitaxy 428) may grow from the underlying semiconductor layer with relatively fine crystallinity. As such, the epi quality of the S/D epitaxy 428 can be much better than growing S/D epitaxy from exposed sidewall surfaces of nanosheet channel layers 405.

FIG. 4I is a block diagram of nanosheet device 400I in fabrication, in accordance with some embodiments of the present disclosure. The nanosheet device 400I may result from performing an interlayer dielectric (ILD) deposition and chemical mechanical planarization (CMP) on the nanosheet device 400G. The ILD deposition can involve forming the ILD 430 on the STI 414 and grown epitaxies of the S/D epitaxy 428. Chemical mechanical polishing (CMP) removes material to form a planar surface on the dummy gate caps 418 and ILDS 430 of the nanosheet device 400I. Further, the sacrificial layers 404-1, 404-2 lie under the channel region and S/D regions, respectively.

FIG. 4J is a block diagram of nanosheet device 400J in fabrication, in accordance with some embodiments of the present disclosure. The nanosheet device 400J may result from performing operation 308 on the nanosheet device 400I. More specifically, the fabrication tool may create access trench 432-1 and/or access trench 432-2 (collectively referred to herein as trenches 432), which can provide access to the supplemental sacrificial liner 410, thus also providing access to the sacrificial liner 404. According to some embodiments of the present disclosure, the fabrication tool may perform a gate cut for the access trench 432-1 and/or a S/D contact cut for the access trench 432-2. Alternatively, the fabrication tool may form both a gate cut and S/D contact cut (e.g., access trenches 432-1, 432-2) form a gate cut (e.g., access trench 432-1), or S/D contact cut (e.g., access trench 432-2), but not both.

FIG. 4K is a block diagram of nanosheet device 400K in fabrication, in accordance with some embodiments of the present disclosure. The nanosheet device 400K may result from performing operation 310 on the nanosheet device 400J. The access trenches 432-1, 432-2 can provide access to the supplemental sacrificial liner 410. Because the supplemental sacrificial liner 410 is connected to the sacrificial liner 404 and composed of the same material, the fabrication tool may remove the sacrificial liner 404 and supplemental sacrificial liner 410 together. In this way, some embodiments of the present disclosure can create a bottom layer cavity 434 in the nanosheet device 400K. Additionally, the tool may perform silicon trimming. Silicon trimming can involve a selective etching process to remove a few nanometers of Si, and this will remove the thin Si layer under the nanosheet stack.

FIG. 4L is a block diagram of nanosheet device 400L in fabrication, in accordance with some embodiments of the present disclosure. The nanosheet device 400L may result from performing operation 312 on the nanosheet device 400K. More specifically, a fabrication tool may fill the bottom layer cavity 434 (described with respect to nanosheet 400K) with dielectric material, thus creating a BDI layer 436. The fabrication tool may fill the bottom layer cavity through trench 432-1 and/or trench 432-2, depending on the cut(s) the fabrication tool performs to create one or more trenches 432, the gate cut or S/D contact cut.

FIG. 4M is a block diagram of nanosheet device 400M in fabrication, in accordance with some embodiments of the present disclosure. The nanosheet device 400M may result from performing a dummy gate cap open (by either CMP or etch), dummy gate removal, and SiGe release on the nanosheet device 400L. For dummy gate removal, the fabrication tool may remove the dummy gates 416 selective to the surrounding materials. With respect to SiGe release, the fabrication tool may etch the sacrificial SiGe30 selective to Si nanosheets other surrounding materials.

FIG. 4N is a block diagram of nanosheet device 400N in fabrication, in accordance with some embodiments of the present disclosure. The nanosheet device 400N may result from forming high-k metal gates 438 and dielectric gate caps 440 on the nanosheet device 400M.

FIG. 4O is a block diagram of nanosheet device 400O in fabrication, in accordance with some embodiments of the present disclosure. The nanosheet device 400O may result from performing a selective ILD etch back on the nanosheet device 400N. With the selective ILD etch back, the creates openings 442 for contacts. The contacts are described in greater detail with respect to FIG. 4P. According to some embodiments of the present disclosure, if there is no S/D contact cut 432-2 being formed earlier, the fabrication tool may perform this process with a litho mask. Further, the fabrication tool may form the contact trench using a conventional litho and etch process to the exposed S/D epi.

FIG. 4P is a block diagram of nanosheet device 400P in fabrication, in accordance with some embodiments of the present disclosure. The nanosheet device 400P may result from forming contacts 444 on the nanosheet device 400O. More specifically, a fabrication tool may deposit contact metals comprising a silicide liner, such as Ti, Ni, NiPt, and a thin adhesion layer, such as TiN and conductive metal fill, such as Co, Ru, W, etc., followed by metal CMP.

In this way, aspects of the present disclosure may provide a nanosheet device, such as the nanosheet device 200 that mitigates parasitic capacitance and leakage current. Further, such embodiments may mitigate defects from S/D epitaxial growth.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A system comprising:
a semiconductor structure comprising:
    a plurality of channel layers;
    a dielectric liner that is in contact with a substrate island, wherein the dielectric liner wraps around a top and a first side of the substrate island, wherein the dielectric liner separates a substrate from a gate stack, wherein the plurality of channel layers are located above the substrate island, wherein the dielectric liner is located between the top of the substrate island and the plurality of channel layers;
    a shallow trench isolation layer directly located on a second side of the substrate island, wherein the second side of the substrate island is located on an opposite side of the substrate island than the first side of the substrate island; and
    an access trench in physical contact with the dielectric liner.

2. The system of claim 1, further comprising an S/D epitaxy buffer in contact with a bottom dielectric layer.

3. The system of claim 2, further comprising an S/D epitaxy, wherein the S/D epitaxy is formed on the S/D epitaxy buffer.

4. The system of claim 1, wherein the access trench comprises a gate cut pillar that separates a plurality of gate regions from a corresponding plurality of different nanosheet devices.

5. The system of claim 1, wherein the access trench comprises a source/drain (S/D) contact cut pillar that separates a plurality of contacts from a corresponding plurality of different nanosheet devices.

6. The system of claim 1, further comprising an added access trench, wherein:
    the access trench comprises a gate cut pillar that separates a plurality of gate regions from a corresponding plurality of different nanosheet devices; and
    the added access trench comprises a source/drain (S/D) contact cut pillar that separates the plurality of contacts from the corresponding plurality of different nanosheet devices.

7. The system of claim 1, wherein the dielectric liner is formed by filling a cavity with dielectric material through the access trench.

8. A system comprising:
a semiconductor structure comprising:
    a plurality of channel layers;
    an asymmetrical dielectric liner that that is in contact with a substrate island, wherein the asymmetrical dielectric liner asymmetrical wraps around a top and a first vertical side of the substrate island, wherein the dielectric liner separates a substrate from a gate stack, wherein the plurality of channel layers are located above the substrate island, wherein the asymmetrical dielectric liner is located between the top of the substrate island and the plurality of channel layers and
    an access trench in physical contact with the dielectric liner.

9. The system of claim 8, further comprising an S/D epitaxy buffer in contact with a bottom dielectric layer.

10. The system of claim 9, further comprising an S/D epitaxy, wherein the S/D epitaxy is formed on the S/D epitaxy buffer.

11. The system of claim 8, wherein the access trench comprises a gate cut pillar that separates a plurality of gate regions from a corresponding plurality of different nanosheet devices.

12. The system of claim 8, wherein the access trench comprises a source/drain (S/D) contact cut pillar that separates a plurality of contacts from a corresponding plurality of different nanosheet devices.

13. The system of claim 8, further comprising an added access trench, wherein:
    the access trench comprises a gate cut pillar that separates a plurality of gate regions from a corresponding plurality of different nanosheet devices; and
    the added access trench comprises a source/drain (S/D) contact cut pillar that separates the plurality of contacts from the corresponding plurality of different nanosheet devices.

14. The system of claim 8, wherein the asymmetrical dielectric liner is formed by filling a cavity with dielectric material through the access trench.

15. The system of claim 8, further comprising:
    a second layer located adjacent to a second vertical side of the substrate island, wherein the asymmetrical dielectric liner does not contact the second vertical side of the substrate island.

16. The system of claim 15, wherein the second layer is located adjacent to the asymmetrical dielectric liner that is located on top of the substrate island.

* * * * *